United States Patent
Molzer et al.

(10) Patent No.: US 9,252,077 B2
(45) Date of Patent: Feb. 2, 2016

(54) PACKAGE VIAS FOR RADIO FREQUENCY ANTENNA CONNECTIONS

(71) Applicants: Wolfgang Molzer, Ottobrunn (DE); Edmund Goetz, Dachau (DE); Reinhard Mahnkopf, Oberhaching (DE); Bernd Memmler, Riemerling (DE)

(72) Inventors: Wolfgang Molzer, Ottobrunn (DE); Edmund Goetz, Dachau (DE); Reinhard Mahnkopf, Oberhaching (DE); Bernd Memmler, Riemerling (DE)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/037,213

(22) Filed: Sep. 25, 2013

(65) Prior Publication Data
US 2015/0084194 A1    Mar. 26, 2015

(51) Int. Cl.
*H01L 23/48* (2006.01)

(52) U.S. Cl.
CPC ..... *H01L 23/481* (2013.01); *H01L 2224/16225* (2013.01); *H01L 2924/15311* (2013.01)

(58) Field of Classification Search
CPC .................. H01L 23/481; H01L 2924/15311; H01L 2224/16225; H01L 23/48
USPC ................................... 257/659, 773, 774, 741
See application file for complete search history.

(56) References Cited

U.S. PATENT DOCUMENTS

| | | | | |
|---|---|---|---|---|
| 4,858,077 | A * | 8/1989 | Shinohara et al. | 361/784 |
| 7,436,679 | B2 * | 10/2008 | Iijima et al. | 361/760 |
| 7,728,774 | B2 * | 6/2010 | Akkermans et al. | 343/700 MS |
| 8,169,060 | B2 * | 5/2012 | Maurer et al. | 257/662 |
| 8,269,671 | B2 * | 9/2012 | Chen et al. | 343/700 MS |
| 8,451,581 | B2 * | 5/2013 | Chandrasekaran et al. | 361/306.1 |
| 8,558,637 | B2 * | 10/2013 | Liu et al. | 333/33 |
| 8,759,950 | B2 * | 6/2014 | Kamgaing et al. | 257/621 |
| 8,810,025 | B2 * | 8/2014 | Liu et al. | 257/702 |
| 8,853,830 | B2 * | 10/2014 | Chang et al. | 257/621 |
| 2007/0235864 | A1 * | 10/2007 | Megahed | 257/723 |
| 2008/0079139 | A1 * | 4/2008 | Ye et al. | 257/700 |
| 2012/0261826 | A1 * | 10/2012 | Kuo et al. | 257/774 |
| 2013/0051493 | A1 * | 2/2013 | Mo et al. | 375/297 |
| 2013/0292808 | A1 * | 11/2013 | Yen et al. | 257/660 |
| 2014/0035892 | A1 * | 2/2014 | Shenoy et al. | 345/205 |
| 2014/0131858 | A1 * | 5/2014 | Pan et al. | 257/737 |
| 2014/0247195 | A1 * | 9/2014 | Yen | 343/873 |
| 2015/0076666 | A1 * | 3/2015 | Chiang et al. | 257/621 |

* cited by examiner

*Primary Examiner* — Alexander Oscar Williams
(74) *Attorney, Agent, or Firm* — Blakely, Sokoloff, Taylor & Zafman LLP (57) ABSTRACT

Via are described for radio frequency antenna connections related to a package. In one example, a package has a package substrate, a die attached to the package substrate, and a conductive via from the package substrate to an external surface of the package to make a radio frequency connection between the antenna and the package substrate.

17 Claims, 9 Drawing Sheets

PACKAGE VIAS FOR RADIO FREQUENCY ANTENNA CONNECTIONS

FIELD

The present description relates to the field of conductive vias used in semiconductor dies and packages and, in particular, to vias suitable for high frequency antenna connections.

BACKGROUND

Semiconductor dies are typically formed using a silicon substrate. The substrate may form a carrier or the carrier may be the surface upon which the circuitry is built. Channels are drilled, bored, or etched through the silicon to allow metal contacts at one level in the silicon to be connected to another level in the silicon. The channels are referred to as TSVs (Through-Silicon Vias). In order to make an electrical connection, the vias are lined or filled with a conductive material such as copper or aluminum. The vias are used in a variety of different ways. One way is to connect the circuitry formed on one side of the silicon substrate to external connections on the other side of the silicon substrate. These connections may be for power or for data. In some cases, the circuitry is formed in multiple layers on top of one another within the silicon substrate and vias are used to connect circuits on different layers.

Vias are also used in electronic and micromechanical packaging. Many types of packages have a substrate to which one or more dies are attached. The package substrate has an array of electrical connections to the die on one side. The electrical connections are usually using solder balls or wiring pads. The package substrate also has electrical connections on the other side to make an external contact to a socket, a circuit board, or some other surface. In between the connection arrays, there are one or more routing layers to allow points on the die to connect to the external points. TSVs are also used to connect the different routing layers to each other. TMVs (Through-Mold Vias) are used in a similar way within a package to connect components within the package together that are separated by a molding compound.

Through silicon vias (TSVs) are normally filled with a simple metal (e.g. copper (Cu), tungsten (W), aluminum (Al) etc.). The layer stack within the opening of a typical TSV is first a dielectric, such as silicon oxide (SiO2), to electrically isolate the Si sidewall from the metal fill. A metal diffusion barrier and adhesion layer (e.g. Ti, TiN, Ta, TaN, Ru, WN, etc.) is then used over the dielectric in a TSV or TMV to prevent diffusion of metal ions from the metal fill into the Si substrate and to improve the adhesion of the metal fill in the TSV. Finally, a pure metal fill is deposited by appropriate deposition processes (e.g. electroplating, e-less plating, CVD, sputtering, PVD, etc. or a combination of these techniques)

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

Radio frequency communications for electronics systems use increasingly higher frequencies. Connectors used for transmitting and receiving such frequencies are improved herein by taking the wave nature of the electrical signals into account. Wires and copper strips and traces, which are commonly used for routing signals, have an RC (Resistive, Capacitive) component that must be accommodated by impedance matching the line at each end. The added impedance dissipates power, increasing heat and reducing efficiency.

In many packages connections from the on-chip signal paths to the PCB (printed circuit board) run through various forms of package interconnects to the PCB. Due to the topography of this part of the whole package structure, it is also difficult to properly shield electronic circuits from the high frequency signals. Higher frequencies are more prone to cause cross-talk and are more subject to external sources of signal perturbation and interference.

TSVs (Through-Silicon Vias) and TMVs (Through-Mold Vias) can be used in a variety of different types of packages to reduce cross-talk and external perturbations and to provide improved impedance matching. Such vias can also be used to shorten the signal path between circuitry and antennas and to minimize the space required by antennas. Reducing the need for impedance matching or reducing the impedance of a matching line reduces the power losses related to the impedance matching.

Shielding the signal paths from external perturbation and shielding the internal circuitry from the signal paths can be reduced using appropriate via designs. Less shielding also enhances RF performance. The vias allow antennas to be placed very close to related circuits, reducing the space required by antennas in the overall device. This allows for smaller form factors and improved mobile device layouts.

Figure 1:
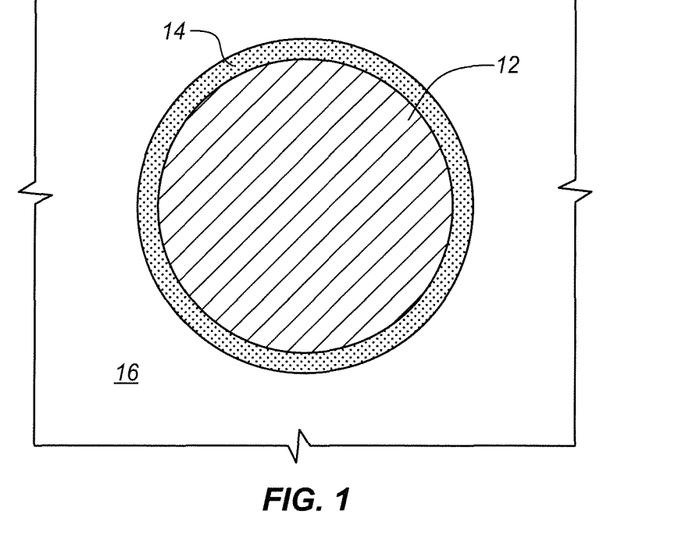
FIG. 1 is a cross-sectional diagram of a TSV (Through-Silicon Via) in a silicon substrate according to an embodiment of the invention.

FIG. 1 is a cross-sectional view of a conventional via with a conductive core 12, typically, but not necessarily, made of copper, surrounded by a dielectric layer 14. The via is within a silicon substrate 16 or within a mold, depending on the particular implementation.

As shown, the inner part or core of the TSV is filled with an ordinary metal such as copper or tungsten while the outer part is covered by a layer of lower resistance. While silver and graphene are suggested as possible materials for the outer layer, any of a variety of other lower resistance materials may be used depending on the particular implementation. In addition, other conductive materials may be used for the inner fill layer instead of copper. Because the inner layer has a higher resistance than the outer layer the loss of conductivity with higher frequency created by the skin effect is overcome by the higher conductivity of the outer layer.

A TSV, such as that shown of FIG. 1, may be formed in any of a variety of different ways. In one example, a TSV is first etched, bored or drilled through the silicon. Typically a TSV will have a diameter of from 1 to 50 micrometers, but may be smaller or larger. This is then filled with a dielectric such as $SiO_2$, $Si_3N_4$, $SiC$ or $SiCN$, or any other suitable dielectric to isolate the silicon substrate from the TSV metal. Next, a lower resistive skin layer, in this example silver or graphene, is applied over the dielectric. As mentioned above, this skin layer transports the electrical current or signals at higher frequencies. Finally, a core conductor or metal fill is deposited into the core of the TSV. The conductor may be a metal such as copper or tungsten or aluminum or some other conductive fill such as a doped polysilicon or another other material.

Figure 2:
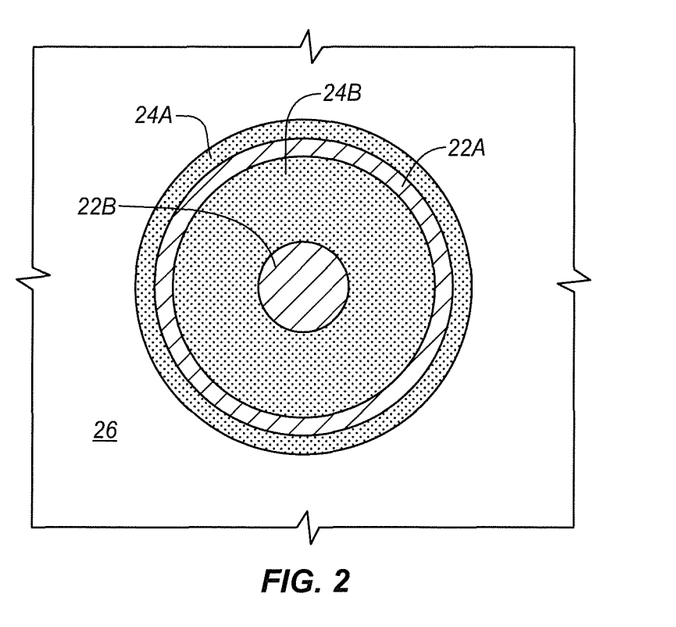
FIG. 2 is a cross-sectional diagram of an alternative TSV in a silicon substrate according to an embodiment of the invention.

In embodiments, one or more TSVs or TMVs are fabricated so that they can be used as coax lines in an appropriate micro-strip or in a "co-planar" like configuration. These approaches allow the RF properties of the vias to be configured for the particular wavelengths and amplitudes that the via carries or a set of vias carry. FIG. 2 shows a cross-sectional diagram of a via that is in a coaxial configuration. An outer conductor 22A surrounds an inner conductor 22B. The conductors are separated by a dielectric 24B and the silicon substrate 26 that surrounds the via isolates the via and the metals from the silicon. The two conductors are coaxial and the structure has radio frequency characteristics similar to coaxial cables and other similar structures.

Figure 3A:
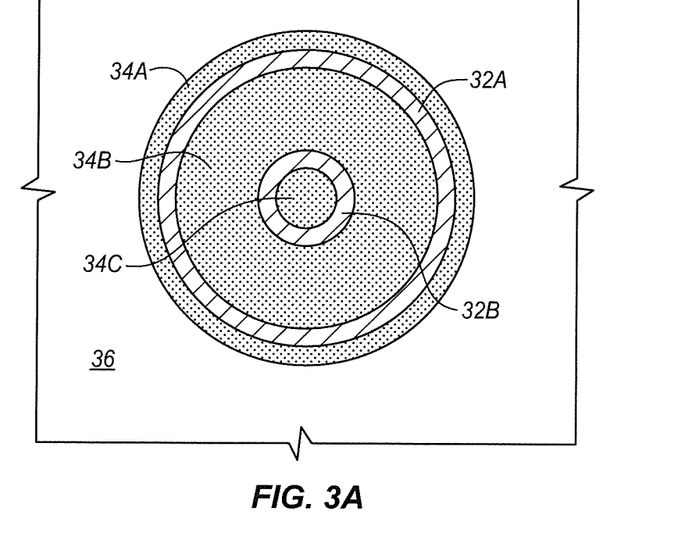
FIG. 3A is a cross-sectional diagram of another alternative TSV in a silicon substrate according to an embodiment of the invention.

FIG. 3A shows a cross-section of a via in a variation in which the two coaxial conductive layers 32A, 32B have a central dielectric core 34C. In other words, there is a single via with concentric conductive rings 32A, 32B separated and surrounded by dielectric layers, an outer dielectric 34A, a dielectric 34B between the conductive rings, and a central dielectric 34C. The via is shown as being through silicon 36, however the same approach may be used for a via through a molding compound 36 or another type of substrate or material.

Figure 3B:
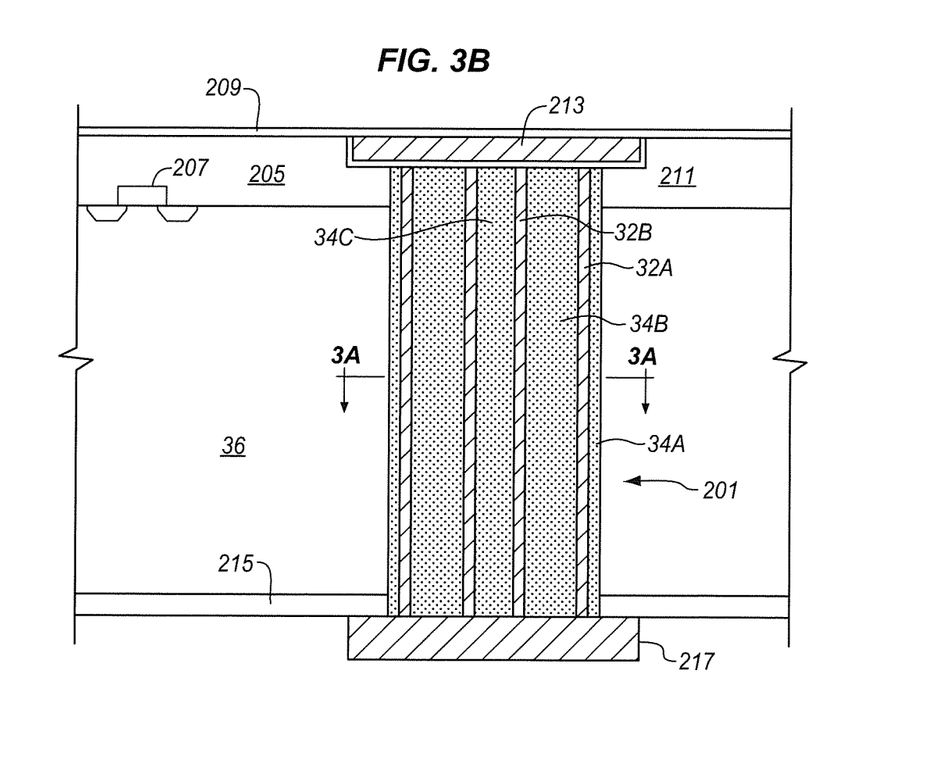
FIG. 3B is a side cross-sectional diagram of the TSV of FIG. 3A in a silicon die according to an embodiment of the invention.

FIG. 3B shows a cross-sectional side view of the via of FIG. 3A with multiple cylindrical or tube type metal fill layers 32A, 32B formed in the area of the single via. Both sides of the metal filled tubes are covered by a dielectric material 34A, 34B, 34C. The center of the tubes 34C may be filled with a dielectric or it may remain as an air gap.

The via is formed through the silicon substrate 36 which has front side 209 and back side 215 dielectric cap layers. Active circuitry 207 is formed over the silicon substrate 36 and insulated by a front side dielectric 211. Metallization layers 213, 217 are formed on either side of the silicon substrate and these metallization layers may be connected together by the via. In this example, a cylindrical dielectric layer 34C has been formed in the middle of the via and this is surrounded with a metal fill 32B with a circular cross section that encircles the dielectric. A second metal fill layer 32A is on the outside of the inner cylindrical metal layer 32B and also on the outside of a second cylindrical dielectric layer 34B. A third dielectric 34A surrounds the two conductive layers. The metallization layers 213, 217 may have three, four or more different layers (not shown for simplicity) and each of the concentric metal fill layers 32A, 32B may connect to any one of the layers within a metallization layer. The metal fill layers may each connect to a different one of the layers of a metallization layer.

Such a via can be formed by first creating the outer dielectric layer 34A then applying the outer conductive layer 32A to the via. A conformal metal deposition can be deposited into the remaining via forming a cylindrical hole in the center of the via. This hole may be lined with a second inner highly conductive layer 32B. The remaining open area of the via may be filled with dielectric 34C or left as an air gap. These concentric rings of material allow for high frequency signal propagation similar to a coaxial cable.

Figure 4A:
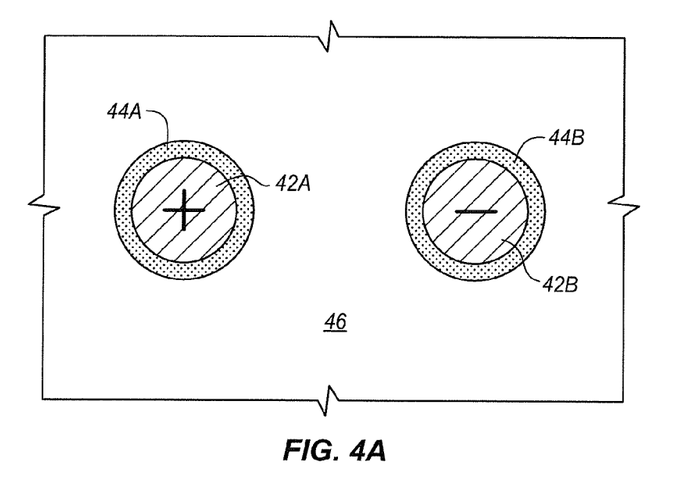
FIG. 4A is a cross-sectional diagram of TSVs in a twin lead configuration in a silicon substrate according to an embodiment of the invention.

FIG. 4A is another alternative via configuration in which there are two vias in a twin lead configuration. A signal via has a signal line 42A, surrounded by dielectric 44A. A second ground via has a ground line 42B also surrounded by a dielectric 44B within the substrate 46. The two lines may be opposite polarity and change with, for example differential signaling, or one line may represent the signal and the other a ground plane or reference plane by which the signal may be compared to determine the value.

Figure 4B:
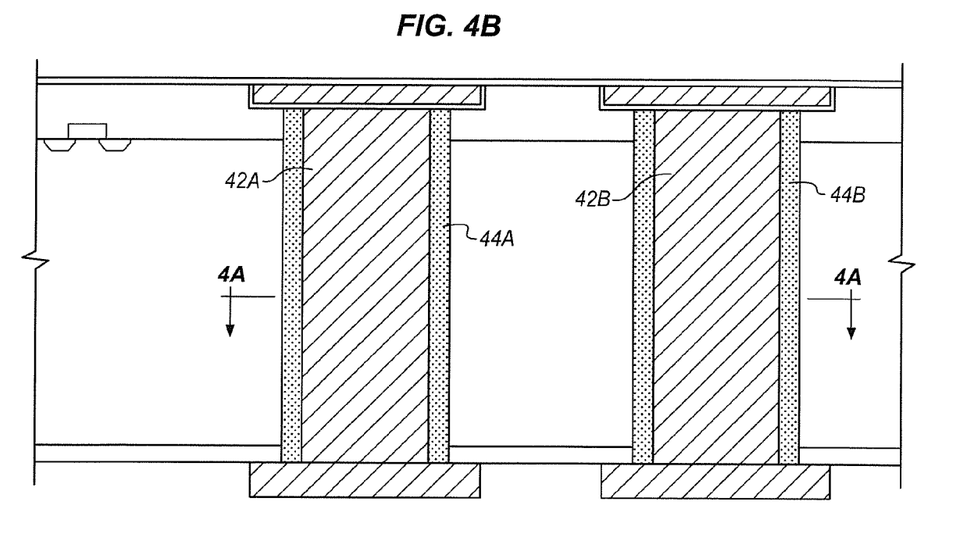
FIG. 4B is a side cross-sectional diagram of the TSV of FIG. 4A in a silicon die according to an embodiment of the invention.

FIG. 4B is a cross-sectional side view diagram of one of the TSVs of FIG. 4A in the silicon substrate 46. The silicon substrate in this example has a transistor layer 105 formed over the substrate with circuitry formed of transistors 107 and other active and passive devices. This layer is sometimes referred to as the FEOL (Front End of the Line). The substrate has a dielectric cap layer 109 over the transistors and other devices. A front side dielectric 111 is formed over the transistors and a front side metallization 113 is formed to connect with specific contact areas provided for in the transistor layer 105. The metallization typically forms one or more different routing layers over the top of the transistors which are insulated from the transistors by the front side dielectric 111.

The entire structure is covered by a dielectric cap layer 109 and other layers may also be used depending on the particular implementation. On the opposite side of the silicon substrate 103, a dielectric back side isolation layer 115 is formed over the back side of the substrate 103. Backside metallization layers 117 are formed over the dielectric layer. The front side metallization layers and the backside metallization layers are coupled together using vias as shown. While a silicon substrate is shown, the substrate may be made of a variety of other dielectric or metal materials. As an alternative to a die substrate as shown, the substrate may be part of a package, a circuit board, or some other structure. Alternatively, the via may be through only the dielectric cap, whether made of deposited layers or material or a molding compound.

In the diagram of FIG. 4B only one pair of the vias is shown so as not to obscure the invention. However, an antenna may be connected through many more sets of vias, similar to the set of two vias of FIG. 4A, the nine vias of FIG. 6, or many more, depending on the particular implementation. The TSV has a central copper filing 42A. The inner copper filing has an outer surface which is surrounded by an outer layer of dielectric 44A. The outside of the dielectric isolation layer 44A may be surrounded by an outer isolation barrier 125 to prevent migration from the via into the silicon.

As shown, the inner part or core of the TSV is filled with an ordinary metal such as copper or tungsten, other conductive materials may be used for the inner fill layer instead of copper.

A TSV may be formed in any of a variety of different ways. In one example, a TSV is first etched, bored or drilled through the silicon. Typically a TSV will have a diameter of from 1 to 50 micrometers, but may be smaller or larger. This is then filled with a dielectric such as $SiO_2$, $Si_3N_4$, SiC or SiCN, or any other suitable dielectric to isolate the silicon substrate from the TSV metal. Next, a core conductor or metal fill is deposited into the core of the TSV. The conductor may be a metal such as copper or tungsten or aluminum or some other conductive fill such as a doped polysilicon or another other material. Similar techniques may be applied to form vias into molding compounds, package substrates, etc.

Figure 5:
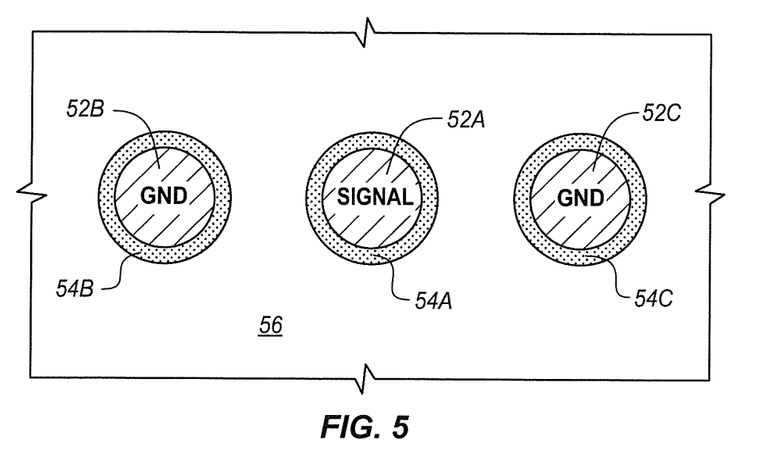
FIG. 5 is a cross-sectional diagram of TSVs in a waveguide configuration in a silicon die according to an embodiment of the invention.

FIG. 5 shows a vertical waveguide approach to using multiple vias. In the example of FIG. 5, a cross-sectional view of three vias is provided. The signal via has a signal line 52A surrounded by a dielectric 54A. The signal via is flanked on opposite sides with ground vias. The ground vias have ground lines 52B, 52C, also isolated by dielectric layers 54B, 54C within the silicon substrate 56 or molding compound. For purposes of RF signal propagation, the three nearby vias form a waveguide centered on the signal line and bounded by the ground vias.

Figure 6:
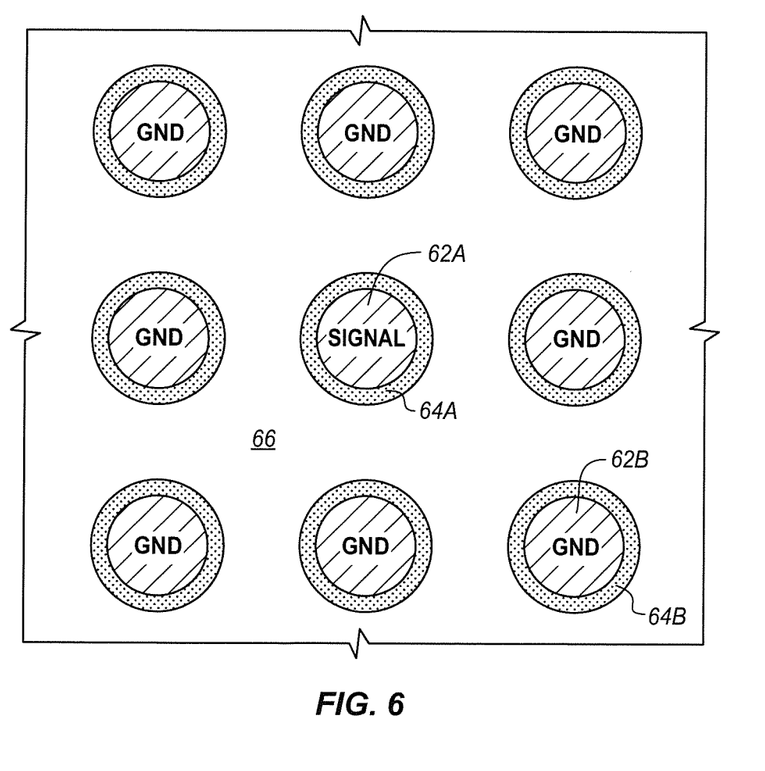
FIG. 6 is a cross-sectional diagram of TSVs in a strip-line configuration in a silicon die according to an embodiment of the invention.

FIG. 6 shows a group of vias in cross-section in another configuration that functionally resembles strip-line. In this example, the signal via with signal line 62A through the substrate 66 isolated by the dielectric 64A is surrounded by ground vias. In this example, the vias are vertically, horizontally, and diagonally surrounding the signal via. Accordingly eight ground vias each with a central isolated 64B and grounded conductive region 62B provides an isolation area for the signal via. In this example, the vias are in a rectangular configuration so that the nine vias including the central signal via form three rows and three columns. The vias are each equidistant from the via to the left and the right and the via above and below. An RF signal will propagate through such a configuration in a manner similar to propagation through stripline.

Figure 7:
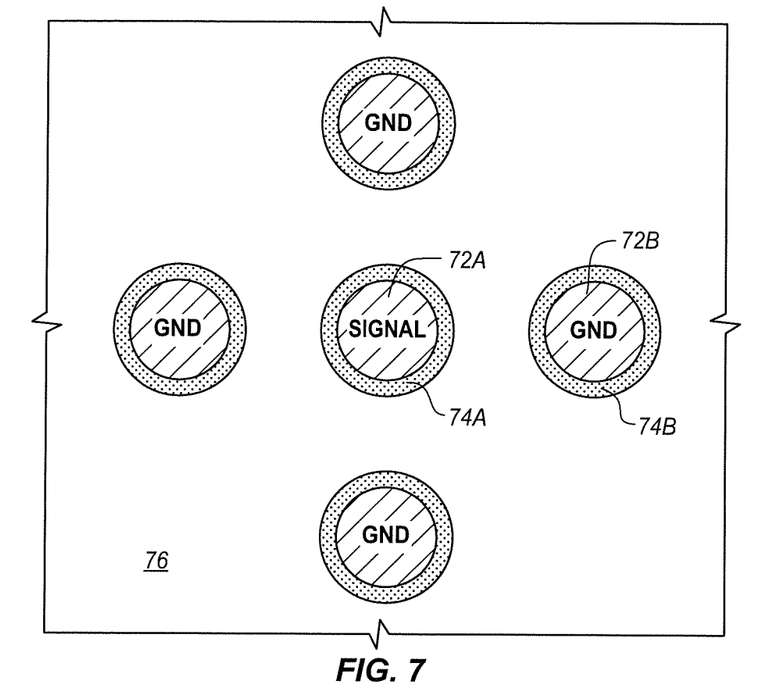
FIG. 7 is a cross-sectional diagram of TSVs in a simplified strip-line configuration in a silicon die according to an embodiment of the invention.

FIG. 7 provides another example of a signal via with isolated 74A signal line 72A in a silicon substrate, mold, or other type of substrate 76. The signal via has ground lines 72B surrounded by dielectric 74B on each of four sides. The ground vias are above, below, left and right in the illustrated example. In other words they extend in two orthogonal directions from the central signal line The particular orientation in this and any other of the examples may be rotated, reversed, or shifted to any desired degree. The spacing may also be increased or decreased to obtain the desired characteristics. In this case there are four ground vias all equidistant from the signal via and equidistant from each other. In other words, the ground vias are spaced evenly around the signal via. Two of the ground vias are in a vertical line with the signal via and two are in a horizontal line.

Figure 8:
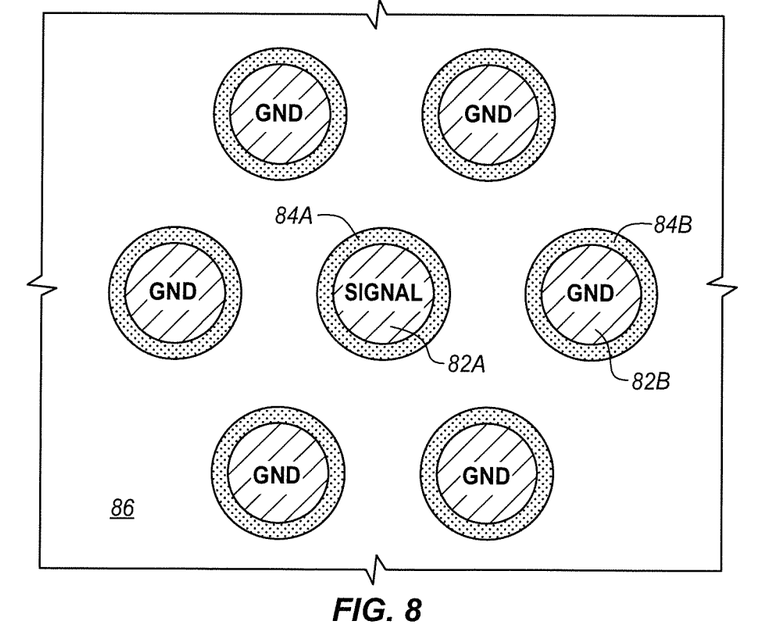
FIG. 8 is a cross-sectional diagram of TSVs in a simplified waveguide configuration in a silicon die according to an embodiment of the invention

The number of ground vias surrounding the signal via may be modified to achieve the desired electrical and frequency characteristics. While there are four ground vias in FIG. 7, FIG. 8 shows an alternative example using six ground vias each with a ground line 82B surrounded by a dielectric layer 84B. The particular number from three to many more than six may be modified to realize the desired frequency characteristics for the central via. The central via in this case has an isolated 84a signal line 82A surrounded by ground vias that form a circle with each ground via being equidistant from the signal via around the signal via.

FIGS. 4 to 8 show a variety of different configurations that resemble a twin lead, waveguide, or strip line signal propagation system using an arrangement of vias. The different configurations are provided only as examples. There may be more or fewer ground vias in each case. In addition while, for example the configurations of FIGS. 5 and 7 represent rectangular configurations with two and four ground vias. These may also be considered to be round configurations.

As a further alternative, with differential signaling there may be configurations with two signal vias, one for each signal, such as in the example of FIG. 4. The two differential signal vias may be complemented with any of a variety of different arrangements of ground vias. The ground vias may be in any of the configurations of FIGS. 5 to 8 or in another configuration.

Figure 9:
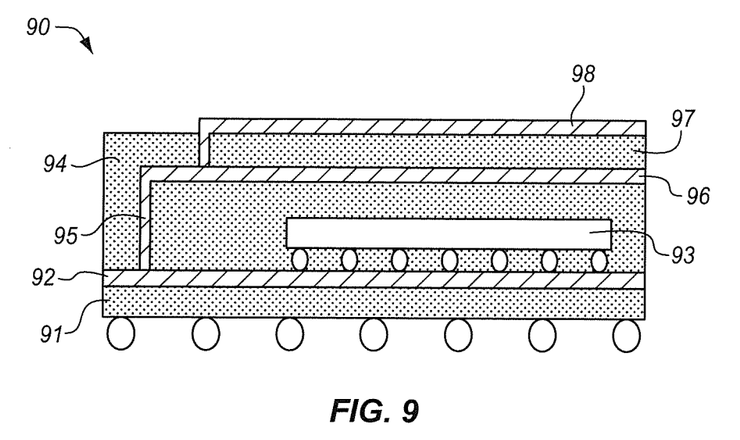
FIG. 9 is a cross-sectional side view diagram of a flip-chip package with TSVs according to an embodiment of the invention.

FIG. 9 is a cross-sectional side view to show the application of any one or more of the via configurations of FIGS. 2-8 applied to a packaged die. The package 90 has a substrate 91 with redistribution layers. The package substrate connects to a mother board or other device to make connections with external components. The substrate includes a metallization layer 92 with connection pads and routing and redistribution to connect to a die 93. The die, in this example is a flip chip die surface mounted to the substrate using any of a variety of different connection technologies. The die is covered with a molding compound 94 to protect and isolate the die from external environmental effects. Alternatively, a package cover or any of a variety of other types of protection systems may be used.

A second metallization and routing layer 96 is applied over the molding compound and a second package substrate 97 is attached over the second routing layer. The second substrate may be used to make other connections to the die using other vias (not shown) for power, data, or test. An antenna 98 is formed on or attached to the second package substrate 97. The antenna can first be formed in a second process and applied to the package substrate or it may be formed by layering and deposition techniques directly on the package substrate. The package substrate is formed in a separate process and then aligned and attached to the second redistribution layer. The design and configuration of the antenna may be adapted to suit any particular radio signaling system. There may be transmit and receive antennas, multiple antennas for a single multiple antenna communication system or multiple different types of antennas to suit different communication systems. The second package substrate may be used In the illustrated example, the antenna is coupled to the second redistribution layer through a TSV to the second redistribution layer. The second redistribution layer is coupled through a TMV to the first redistribution layer. The antenna is then coupled to the die 93 or the external system or both through the first redistribution layer and the package substrate. While a single via is shown in this example, for simplicity, there may be many vias of many different types. The TSVs and the TMVs may be of any of the types shown in FIGS. 2-8 and described herein.

The die 93 may be an active device component such as a power amplifier, a low noise amplifier or RF (radio frequency) switch formed in silicon or gallium arsenide before being attached to the substrate. The die may amplify or send selected RF signals to the antenna 98 through the via 95. Received signals from the antenna may be routed through an antenna switch and a low noise amplifier of the die to select and amplify the received RF signal. Alternatively, the die may be a SOC (System on a Chip) die which includes a power amplifier. Alternatively, the package may include multiple RF and baseband chips for sending and receiving signals through the amplifiers. The antennas may be coupled at appropriate locations through other vias (not shown) to other components (not shown) so that the signals received by the antennas may be carried for down conversion, demodulation, baseband processing and other RF stages and to the die 93.

Figure 10:
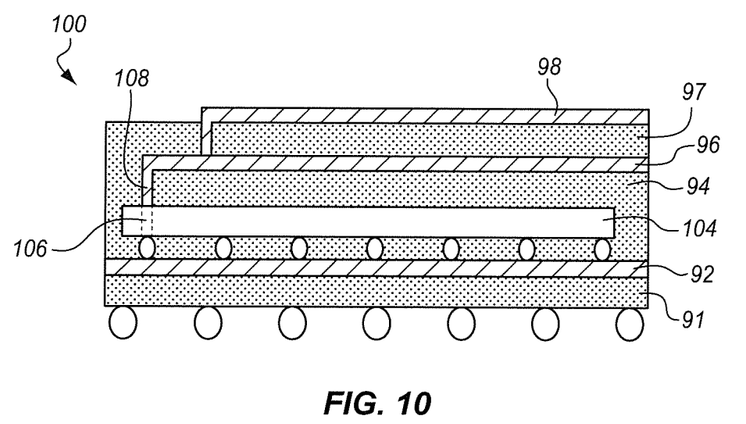
FIG. 10 is a cross-sectional side view diagram of a flip-chip package with TSVs and a larger die according to an embodiment of the invention.

FIG. 10 is a cross-sectional side view to show a variation of the package of FIG. 9. All of the same components are used except that in this case the die 104 is wider and extends through the position of at least some of the vias 106, 108 between the upper metallization layer 96 and the lower metallization layer 92. In this example the connection between the upper and lower metallization layers is made in part by a TSV 106 through the die and in part by a TMV 108 above and below the die. In other words, a TMV extends from the upper metallization layer through the mold to the die and connects with the die. The antenna signals may be routed directly into the die for processing and other purposes. Optionally, a TSV conducts the antenna signal through the die to connect to another optional TMV. The lower TMV connects the die to the lower metallization layer. From the lower metallization layer, the antenna may be connected to the die directly or through a redistribution layer of the package substrate. The antenna may also be connected to external components. The external connections of the described examples may be particularly useful for connections to power and ground planes and also to passive filtering and isolation components.

With increasing frequencies, antennas can be made smaller and signals from the antenna have more losses when propagating from the antenna to a die. TSVs and TMVs allow the antenna to be placed closer to a die to avoid losses in between the antenna and the die. By including RDL layers on the top of a package, for example opposite the substrate connection side of chip, and by connecting the RDL layers with TMVs and TSVs, antennas and reflectors can be formed on the package. Patch-, PIF (Planar Inverted F shape) or micro-strip antennas, among others, may be used in the packages shown.

Figure 11:
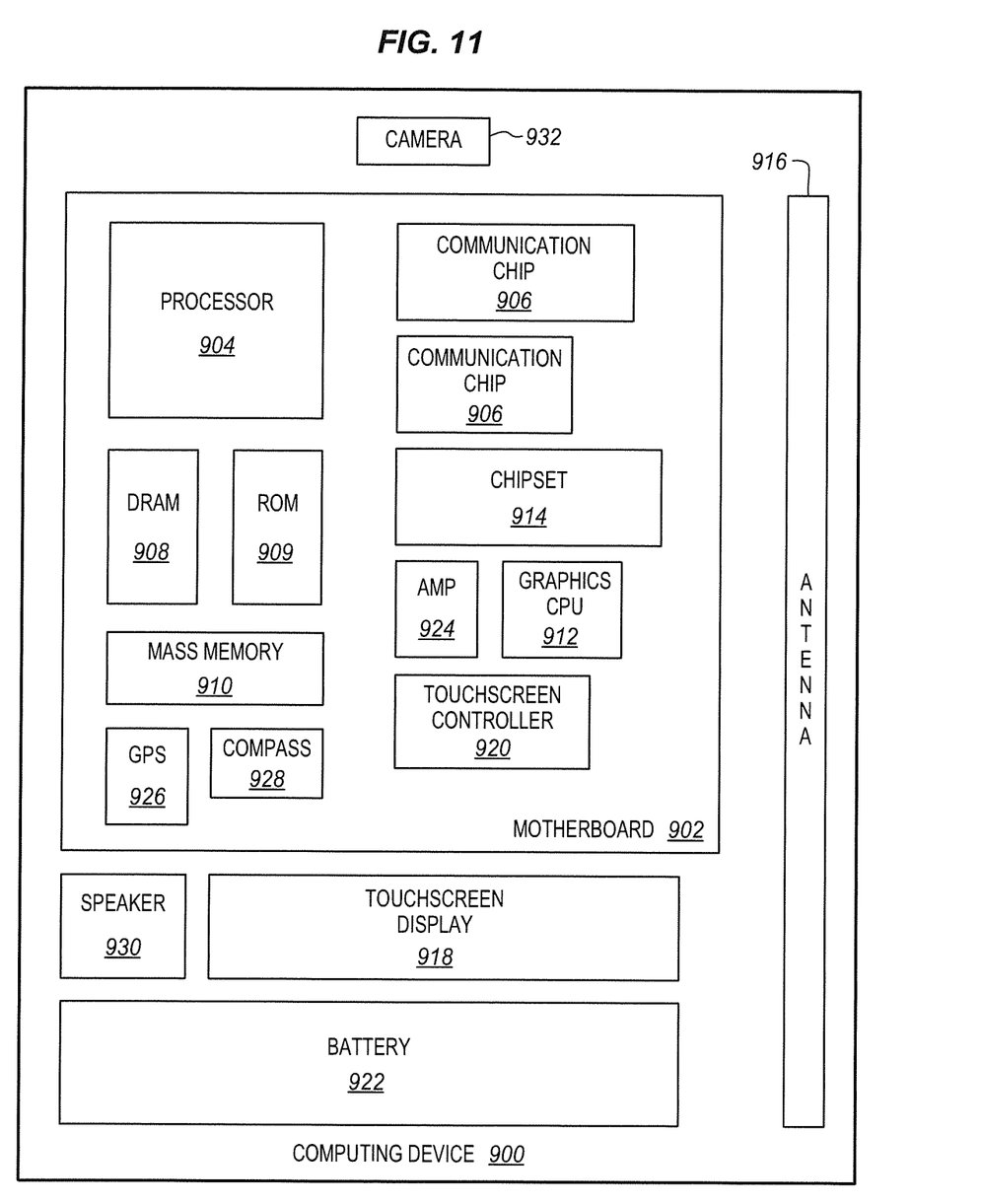
FIG. 11 is a block diagram of a computer system having one or more vias according to an embodiment of the present invention.

FIG. 11 illustrates a computing device 900 in accordance with one implementation of the invention. The computing device 900 houses a system board 902. The board 902 may include a number of components, including but not limited to a processor 904 and at least one communication package 906. The communication package is coupled to one or more antennas 916. The processor 904 is physically and electrically coupled to the board 902. At least one antenna 916 is integrated with a communication package 906 and is physically and electrically coupled to the board 902 through the package. In some implementations of the invention, any one or more of the components, controllers, hubs, or interfaces are formed on dies using through silicon vias as described above. A packaged die 906, 924, 926 may connect to an antenna 916 that is within the package, near the package or external to the package using vias as described. The antenna 916 of the block diagram represents each of these types of antenna locations and connections. It also represents all of the different types of antennas and antenna arrays that may be used by the device.

Depending on its applications, computing device 900 may include other components that may or may not be physically and electrically coupled to the board 902. These other components include, but are not limited to, volatile memory (e.g., DRAM) 908, non-volatile memory (e.g., ROM) 909, flash memory (not shown), a graphics processor 912, a digital signal processor (not shown), a crypto processor (not shown), a chipset 914, an antenna 916, a display 918 such as a touchscreen display, a touchscreen controller 920, a battery 922, an audio codec (not shown), a video codec (not shown), a power amplifier 924, a global positioning system (GPS) device 926, a compass 928, an accelerometer (not shown), a gyroscope (not shown), a speaker 930, a camera 932, and a mass storage device (such as hard disk drive) 910, compact disk (CD) (not shown), digital versatile disk (DVD) (not shown), and so forth). These components may be connected to the system board 902, mounted to the system board, or combined with any of the other components.

The communication package 906 enables wireless and/or wired communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication package 906 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond. The computing device 900 may include a plurality of communication packages 906. For instance, a first communication package 906 may be dedicated to shorter range wireless communications such as Wi-Fi and Bluetooth and a second communication package 906 may be dedicated to longer range wireless communications such as GPS, EDGE, GPRS, CDMA, WiMAX, LTE, Ev-DO, and others.

The processor 904 of the computing device 900 includes an integrated circuit die packaged within the processor 904. The term "processor" may refer to any device or portion of a device that processes electronic data from registers and/or memory to transform that electronic data into other electronic data that may be stored in registers and/or memory.

In various implementations, the computing device 900 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 900 may be any other electronic device that processes data.

Figure 12:
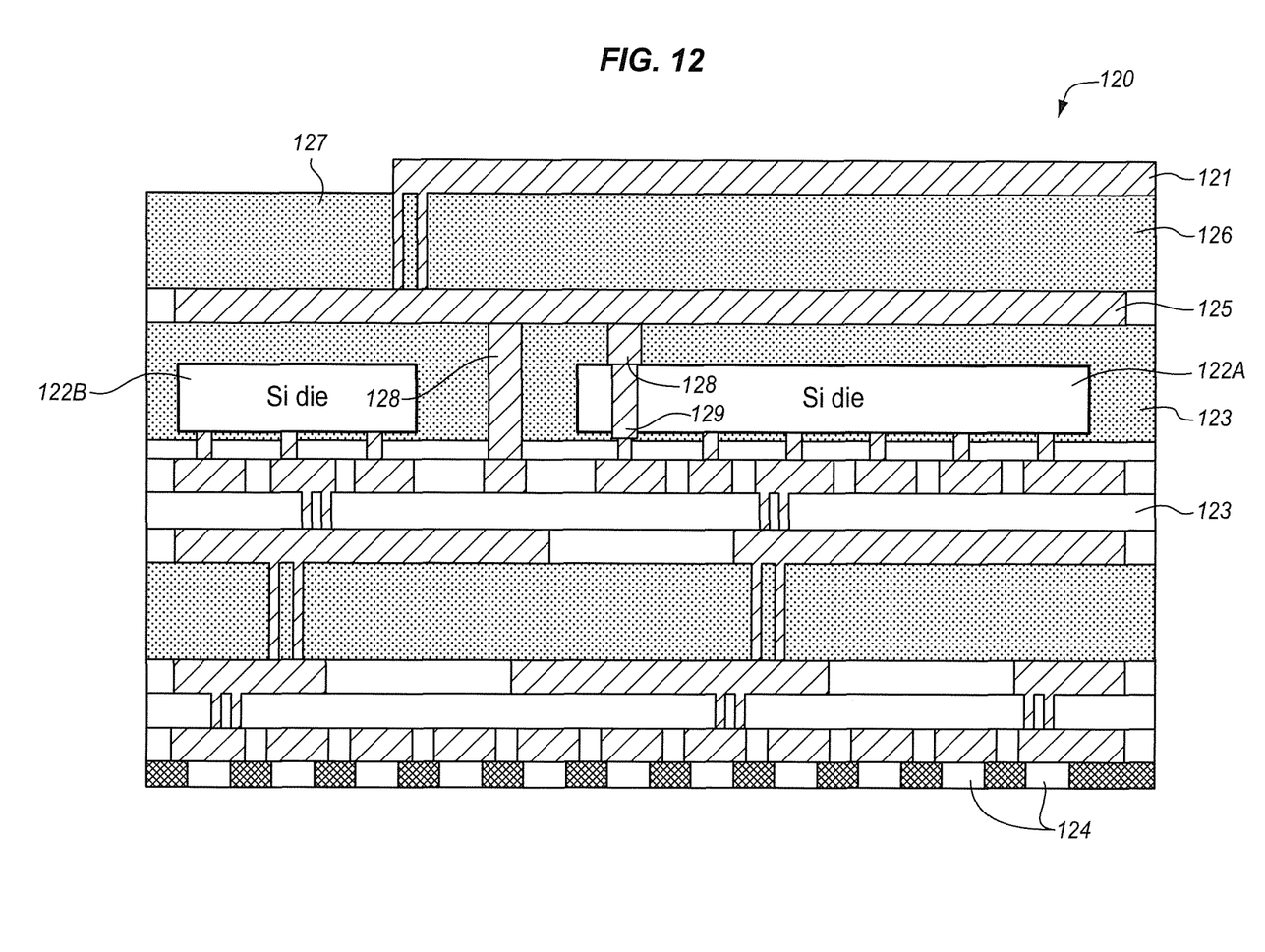
FIG. 12 is a cross-sectional side view diagram of a flip-chip ball grid array package with TSVs and a build-up layer substrate according to an embodiment of the invention.

FIG. 12 is a simplified cross-sectional diagram of an alternative FC-BGA (Flip Chip-Ball Grid Array) package design 120 using antenna vias to connect an antenna 121 mounted over the package 120 to a die 122A and a substrate 123 of the package. The package has one or more dies 122A, 122B mounted to a package substrate or build-up layer 123 through solder bumps. The substrate has multiple routing layers to connect and fan out the solder bump connections to a ball grid array 124. The array is coupled to a PCB using solder balls (not shown) that are attached later. The dies are covered with a molding compound or an air gap and a top metallization layer 125 is applied over the molding compound. Alternatively, the metallization layer may be part of or applied over a package cover.

The package is covered with a top metallization layer 125 that is covered with a dielectric protective layer 126 to which the antenna 121 is applied, deposited, pasted, printed, or attached, as described above. The antenna may be any desired size or shape, depending on the ultimate purpose of the antenna. The antenna 121 is connected through the dielectric 126 by antenna vias 127 as described above. These may be coaxial or in arrays. The antenna is coupled from the top metallization layer through the interior of the package using, for example, through-mold vias 128 of the types described above. The TMVs may connect to the package substrate for an external connection, such as to a ground plane. The TMVs may also connect to one or more dies 122A. Such a connection may be used for transmit or receive signals to be communicated between the antenna and the die. The TMV may also connect to a through silicon via 129 to communicate to other layers of the die 122A or to connect through the die to the package substrate 123 for external connections.

Figure 13:
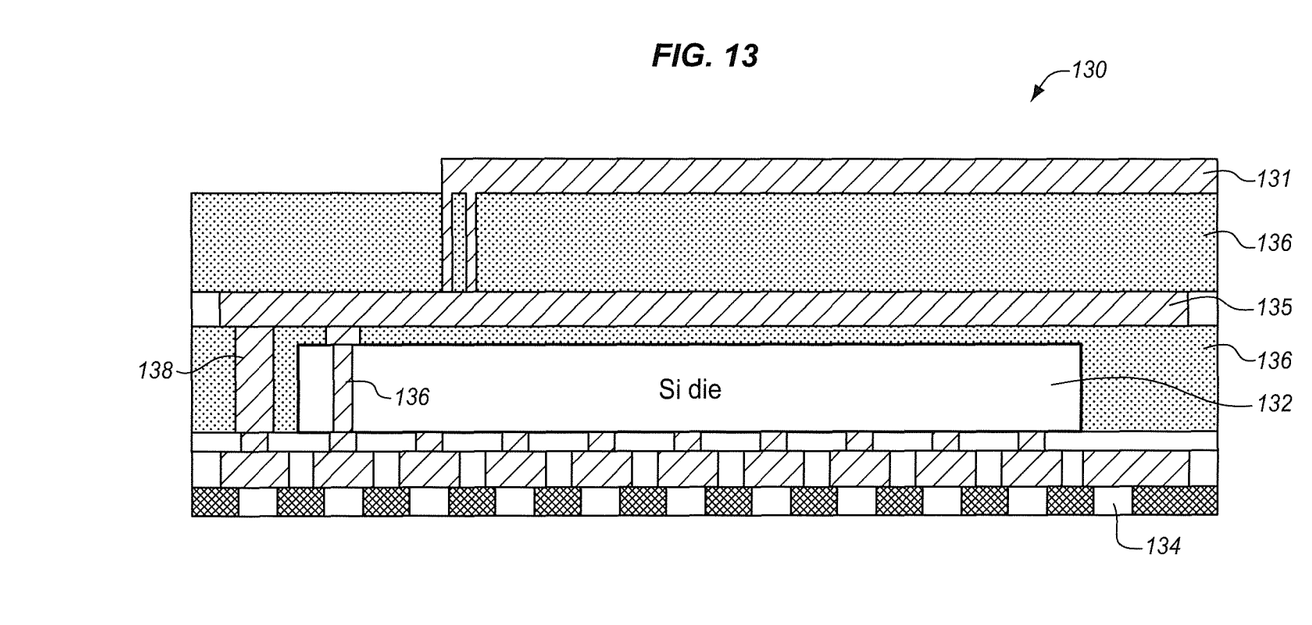
FIG. 13 is a cross-sectional side view diagram of an embedded wafer level ball grid array package with TSVs according to an embodiment of the invention.

FIG. 13 is a simplified cross-sectional diagram of an alternative embedded wafer level ball grid array (eWLB) package design 130 with an antenna 131 connected to a die 132 using radio frequency vias as described above. The package substrate has a ball grid array 134 to attach to other components. The die 132 is covered in molding compound 136 and a package substrate is built up on one side of the die. A metal interconnect layer 135 is formed over the molding compound opposite the package substrate and additional dielectric 136 is applied over the interconnect layer.

An antenna 131 is formed over the top dielectric layer and connected through TMVs to the interconnect layer. From the interconnect layer 125 additional TMVs allow the antenna to be connected to the package substrate and the die. As with the flip-chip example of FIG. 12, a TMV may be connected to a TSV in the die. Through this TSV, the antenna may connect to circuitry in the die or to the package substrate below the die. The antenna may then connect to active circuitry through the package substrate or it may connect to external components through the ball grid array 134.

The different types of packages shown and described herein as examples may be modified by adding additional dies in a vertical or horizontal direction. The packages may be stacked on top of other packages. One example of stacked packages is known as PoP (Package on Package.) The eWLB package may have multiple dies with upper and lower metal interconnect layers. While top-mounted antennas are shown on all of the example packages, these are provided only as an example of possible antenna placement. The antennas may be in a different location or separate from the package. The RF vias, as described herein may be used to connect to an antenna that is separate or apart from the package containing the die.

Embodiments may be implemented as a part of one or more memory chips, controllers, CPUs (Central Processing Unit), microchips or integrated circuits interconnected using a motherboard, an application specific integrated circuit (ASIC), and/or a field programmable gate array (FPGA).

References to "one embodiment", "an embodiment", "example embodiment", "various embodiments", etc., indicate that the embodiment(s) of the invention so described may include particular features, structures, or characteristics, but not every embodiment necessarily includes the particular features, structures, or characteristics. Further, some embodiments may have some, all, or none of the features described for other embodiments.

In the following description and claims, the term "coupled" along with its derivatives, may be used. "Coupled" is used to indicate that two or more elements co-operate or interact with each other, but they may or may not have intervening physical or electrical components between them.

As used in the claims, unless otherwise specified, the use of the ordinal adjectives "first", "second", "third", etc., to describe a common element, merely indicate that different instances of like elements are being referred to, and are not intended to imply that the elements so described must be in a given sequence, either temporally, spatially, in ranking, or in any other manner.

The drawings and the forgoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, orders of processes described herein may be changed and are not limited to the manner described herein. Moreover, the actions of any flow diagram need not be implemented in the order shown; nor do all of the acts necessarily need to be performed. Also, those acts that are not dependent on other acts may be performed in parallel with the other acts. The scope of embodiments is by no means limited by these specific examples. Numerous variations, whether explicitly given in the specification or not, such as differences in structure, dimension, and use of material, are possible. The scope of embodiments is at least as broad as given by the following claims.

The following examples pertain to further embodiments. The various features of the different embodiments may be variously combined with some features included and others excluded to suit a variety of different applications. Some embodiments pertain to a package with a package substrate, die attached to the package substrate, and a conductive via from the package substrate to an external surface of the package to make a radio frequency connection between the antenna and the package substrate.

Embodiments may also include the antenna on the external surface of the package where the conductive via connects to the antenna. In some embodiments, the die attachment to the package substrate includes a radio frequency connection through the package substrate to the conductive via.

Embodiments may also include a molding compound over the die, the molding compound forming the external surface of the package where the package substrate is formed over the die and the molding compound. Embodiments may also include a metal interconnect layer over the molding compound and the antenna formed over the metal interconnect layer.

Embodiments may also include a dielectric layer between the metal interconnect layer and the antenna.

In some embodiments, the conductive via is a through-mold via extending through the molding compound. In some embodiments, the conductive via extends through the die and connects to the package substrate using connectors of the die.

Embodiments may also include a second conductive via through the die to make a radio frequency connection between the antenna and the die.

Some embodiment pertain to a package with a die, molding compound over the die, an antenna over the molding compound, and a via between the die and the antenna through the molding compound to couple signals between the antenna and the die.

In some embodiments, the via has parallel concentric conducting paths isolated by a dielectric. Embodiments may also include additional vias between the die and the antenna wherein some of the vias carry a signal of one polarity and the other vias carry a signal of the other polarity. In some embodiments, the via is copper filled, the die is an upconverter and power amplifier, or the antenna is a copper line on a substrate over the molding compound.

Embodiments may also include a substrate, the die being electrically connected to the substrate where the via is coupled between the antenna and the substrate and the substrate connects the via to the die. Embodiments may also include a second via through the die to first via to the substrate. In some embodiments, the second via is a through-silicon via.

What is claimed is:

1. A package comprising:
   a package substrate;
   a die attached to the package substrate;
   a molding compound over the die and the package substrate forming the external surface of the package;
   an antenna on the external surface of the package; and
   a conductive via from the package substrate to the external surface of the package to make a radio frequency connection between the antenna and the package substrate,
   wherein the via has parallel concentric conducting paths isolated by a dielectric.

2. The package of claim 1, further comprising the antenna on the external surface of the package and wherein the conductive via connects to the antenna.

3. The package of claim 1, wherein the die attachment to the package substrate includes a radio frequency connection through the package substrate to the conductive via.

4. The package of claim 1, wherein the package substrate is formed over the die and the molding compound.

5. The package of claim 4, further comprising:
   a metal interconnect layer over the molding compound; and
   the antenna formed over the metal interconnect layer.

6. The package of claim 5, further comprising a dielectric layer between the metal interconnect layer and the antenna.

7. The package of claim 4, wherein the conductive via is a through-mold via extending through the molding compound.

8. The package of claim 1, wherein the conductive via extends through the die and connects to the package substrate using connectors of the die.

9. The package of claim 1, further comprising a second conductive via through the die to make a radio frequency connection between the antenna and the die.

10. A package comprising:
    a die;
    molding compound over the die and the package substrate forming the external surface of the package;
    an antenna over the molding compound on the external surface of the package; and
    a via between the die and the antenna through the molding compound to couple signals between the antenna and the die,
    wherein the via has parallel concentric conducting paths isolated by a dielectric.

11. The package of claim 10, further comprising additional vias between the die and the antenna wherein a first subset of the additional vias carry a signal of one polarity and a second subset of the additional vias carry a signal of the other polarity.

12. The package of claim 10, wherein the via is copper filled.

13. The package of claim 10, wherein the die is an RF power amplifier.

14. The package of claim 10, wherein the antenna is a copper line on a substrate over the molding compound.

15. The package of claim 10, further comprising a substrate, the die being electrically connected to the substrate and wherein the via is coupled between the antenna and the substrate and the substrate connects the via to the die.

16. The package of claim 15, further comprising a second via through the die to connect the via to the substrate.

17. The package of claim 16, wherein the second via is a through-silicon via.

* * * * *